United States Patent
Tang et al.

(10) Patent No.: US 8,444,373 B2
(45) Date of Patent: May 21, 2013

(54) COOLING FAN MODULE

(75) Inventors: Xian-Xiu Tang, Shenzhen (CN); Zhen-Xing Ye, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 858 days.

(21) Appl. No.: 12/607,968

(22) Filed: Oct. 28, 2009

(65) Prior Publication Data

US 2011/0067836 A1   Mar. 24, 2011

(30) Foreign Application Priority Data

Sep. 18, 2009   (CN) .......................... 2009 1 0307323

(51) Int. Cl.
*F04D 29/60* (2006.01)

(52) U.S. Cl.
USPC ........... 415/60; 415/213.1; 415/126; 361/695

(58) Field of Classification Search
USPC ........ 415/60, 68, 126, 213.1, 214.1; 416/120, 416/198 R; 361/678, 679.46, 679.48, 679.54, 361/688, 689, 690, 691, 692, 693, 694, 695
See application file for complete search history.

(56) References Cited

U.S. PATENT DOCUMENTS 7,054,155 B1 *   5/2006   Mease et al. .................. 361/695

* cited by examiner

*Primary Examiner* — Edward Look
*Assistant Examiner* — Aaron R Eastman
(74) *Attorney, Agent, or Firm* — Altis Law Group, Inc.

(57) ABSTRACT

A cooling fan module includes a first cooling fan pivotally connected with a second cooling fan. The second cooling fan is rotatable relative to the first cooling fan between a first state and a second state. The second cooling fan is located on the first cooling fan in the first state. The second cooling fan is located at a lateral side of the first cooling fan in the second state.

10 Claims, 6 Drawing Sheets

COOLING FAN MODULE

BACKGROUND

1. Technical Field

The present disclosure relates to cooling devices, and particularly to a cooling fan module for use in a computer.

2. Description of Related Art

With increased performance, many electronic components such as central processing units (CPUs) generate increased amounts of heat, thus requiring prompt dissipation. Often, heat sinks attached to the electronic components provide such heat dissipation, with cooling fans often providing airflow to cool the heat sink. However, in addition to CPUs, other electronic components, such as memory cards are reaching performance thresholds over which considerable heat is generated. A single conventional cooling fan cannot efficiently and simultaneously cool the CPU and other components.

Therefore, a cooling fan module is desirable that is able to overcome the described limitations.

DETAILED DESCRIPTION

Figure 1:
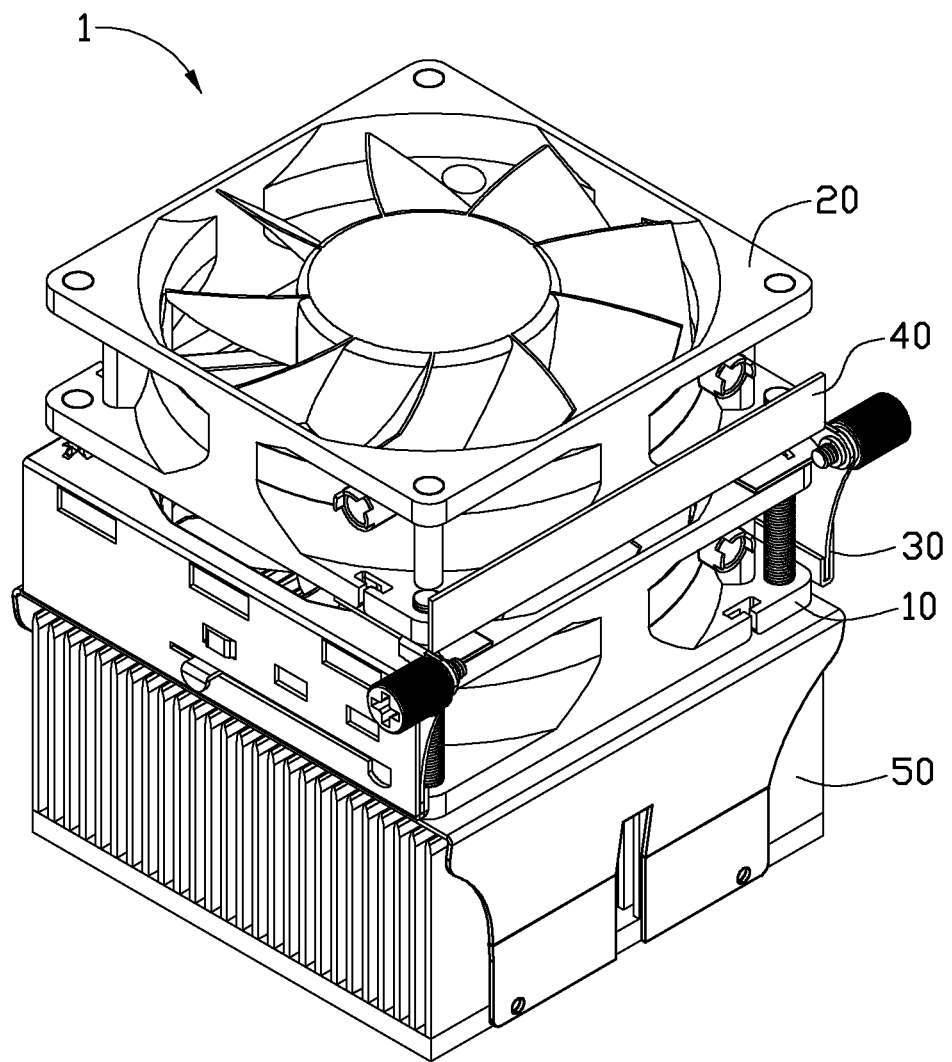
FIG. 1 is an assembled, isometric view of a cooling fan module in a first state in accordance with an embodiment of the present disclosure.

FIG. 1 shows a cooling fan module 1 in a first state. The cooling fan module 1 is mounted on a heat sink 50 in accordance with an embodiment of the present disclosure. The heat sink 50 is particularly mounted on and attached to a CPU (not shown) of a computer whereby heat generated by the CPU is transferred to the heat sink 50 for heat dissipation. The cooling fan module 1 is mounted on the heat sink 50 and provides airflow to cool the heat sink 50. Generally, the computer has other electronic components disposed therein. For example, a memory card of the computer may be disposed adjacent to the CPU.

Figure 2:
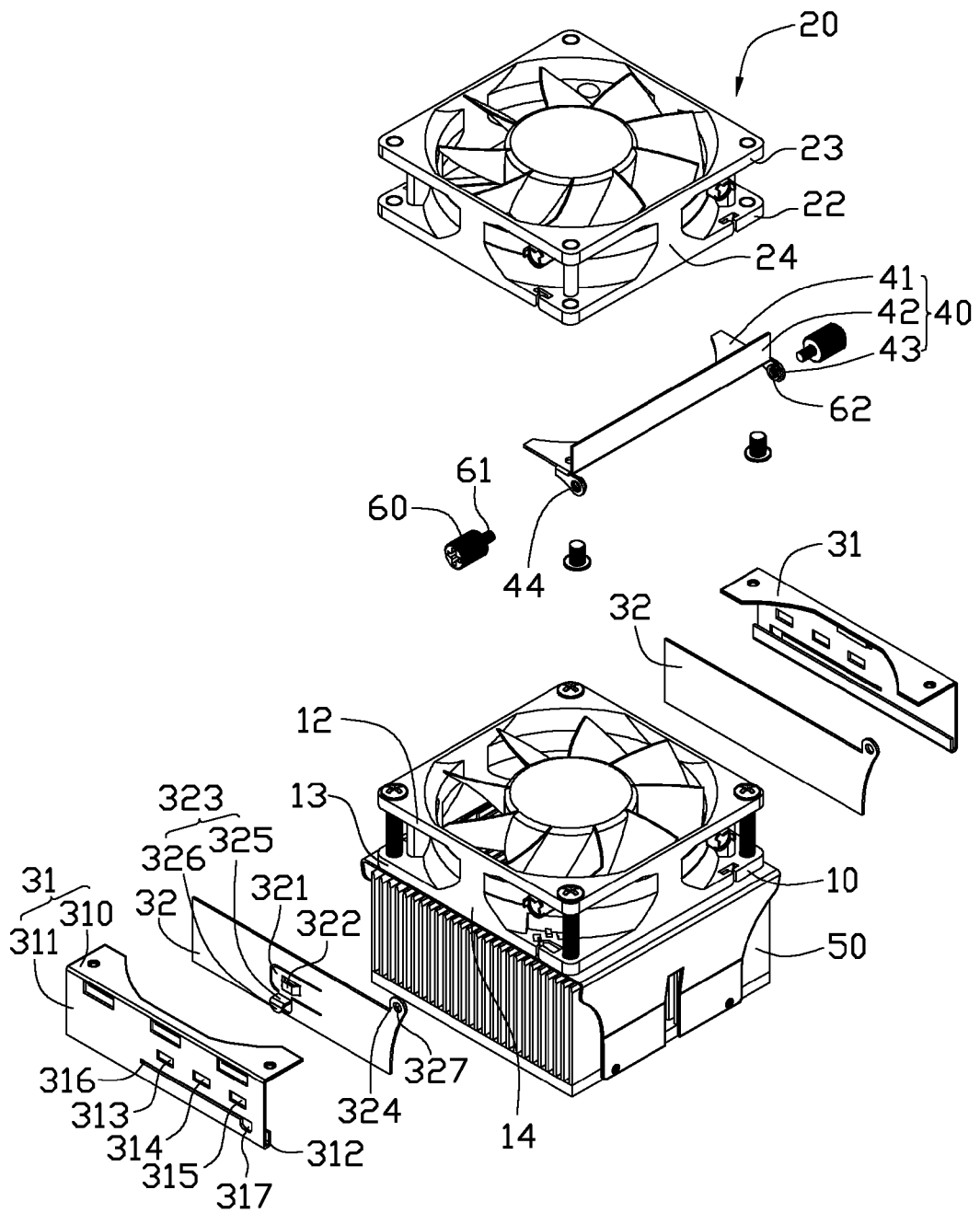
FIG. 2 is an exploded view of the cooling fan module of FIG. 1.

Referring also to FIG. 2, the cooling fan module 1 includes a first cooling fan 10, a second cooling fan 20, two first fan brackets 30 and a second fan bracket 40. Each of the first cooling fan 10 and the second cooling fan 20 includes a top wall 12 (22), a bottom wall 14 (24) and a sidewall 13 (23) interconnecting the top wall 12 (22) and the bottom wall 14 (24). The first cooling fan 10 is mounted on the heat sink 50. The second cooling fan 20 is coaxially mounted on the first cooling fan 10. The second cooling fan 20 is pivotally connected with the first cooling fan 10 via the first fan brackets 30 and the second fan bracket 40. The first cooling fan 10 and the second cooling fan 20 simultaneously provide the airflow downwardly to blow toward the heat sink 50 thereby cooling the heat sink 50.

In the illustrated embodiment, the first cooling fan 10 and the second cooling fan 20 are axial fans generating airflow downwardly toward the heat sink 50. In other embodiments, the first cooling fan 10 and the second cooling fan 20 may be exhausting axial fans generating airflow upwardly away from the heat sink 50.

Figure 3:
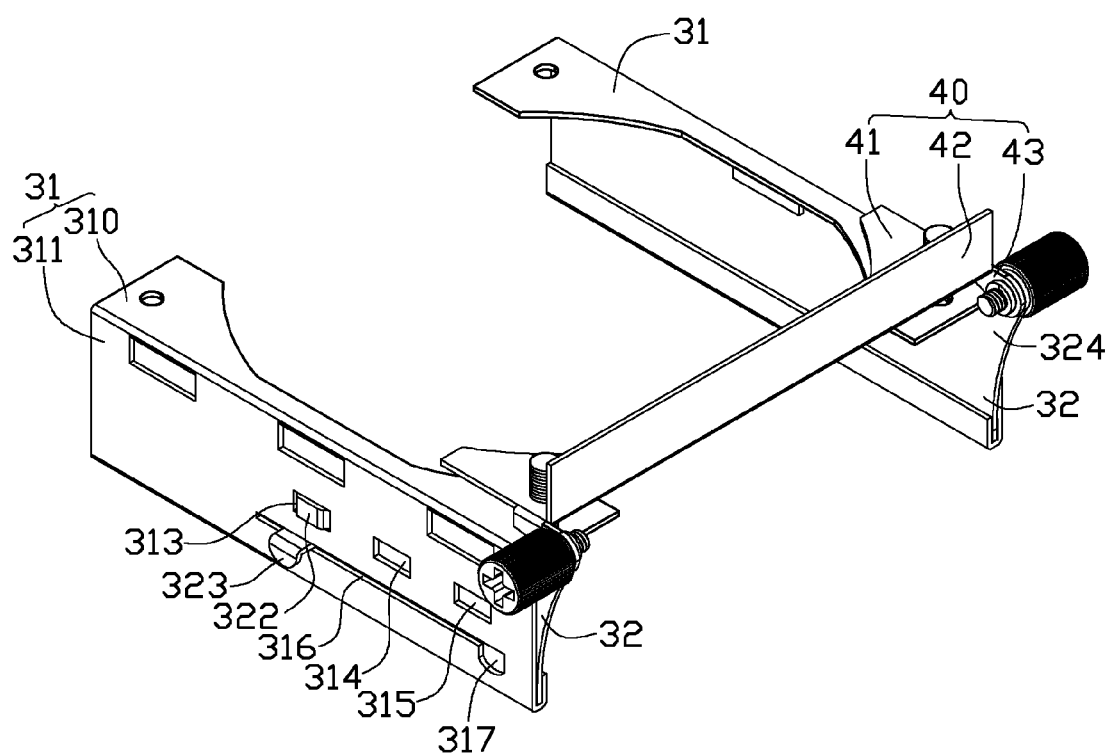
FIG. 3 is an assembled, isometric view of a first fan bracket and a second fan bracket of the cooling fan module of FIG. 1.
Figure 4:
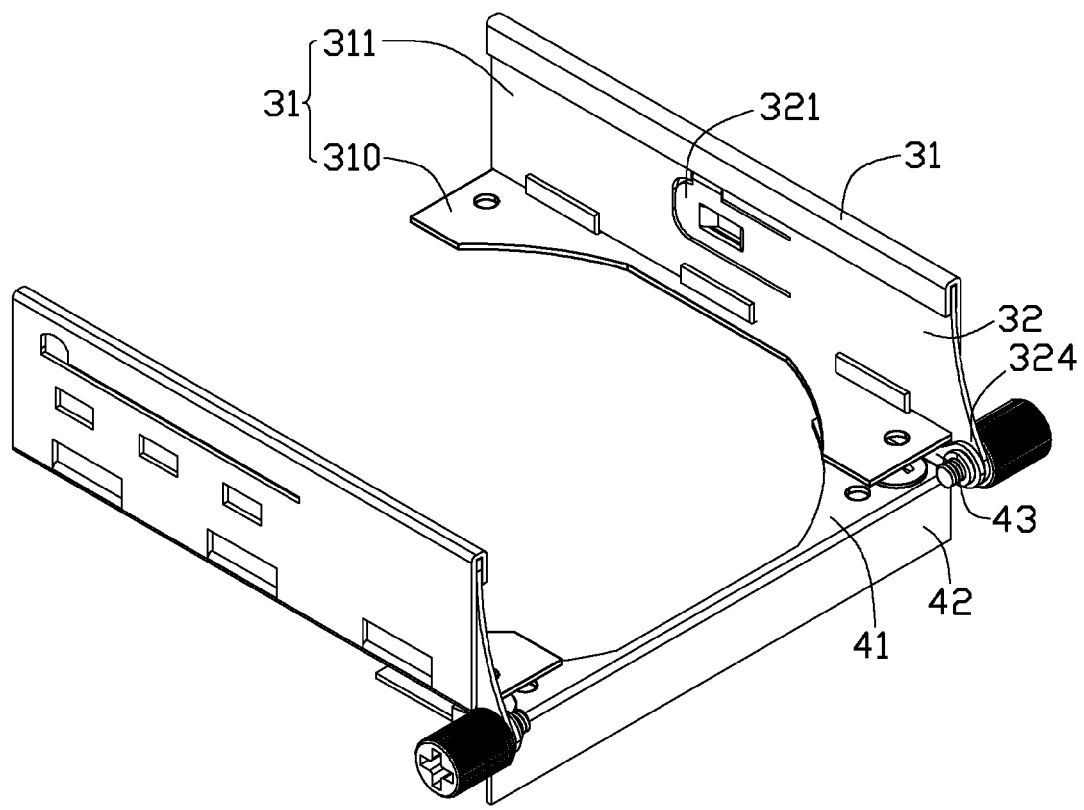
FIG. 4 is an isometric view of the first fan bracket and the second fan bracket of FIG. 3, viewed from another aspect.

Referring also to FIGS. 3-4, the two first fan brackets 30 are symmetrically located at a front side and a rear side of the first cooling fan 10. The two first fan brackets 30 are connected with two opposite ends of the second fan bracket 40, respectively. Each of the two first fan brackets 30 includes a mounting plate 31 and a sliding plate 32. The mounting plate 31 is L-shaped in profile and includes a horizontal top plate 310 and a side plate 311. The horizontal top plate 310 is fixed on the top wall 12 of the first cooling fan 10. The side plate 311 extends downwardly and perpendicularly from an outer side of the horizontal top plate 310 and is attached to the sidewall 13 of the first cooling fan 10. The side plate 311 defines a U-shaped sliding rail 312 at a bottom side thereof. The side plate 311 defines a horizontal sliding slot 316 adjacent to and above the bottom side thereof and three positioning grooves 313 (314, 315) above the sliding slot 316. The side plate 311 defines an expanded notch 317 at a rightmost side of the sliding slot 316, and the expanded notch 317 communicates with the sliding slot 316. The three positioning grooves 313 (314, 315) are spaced from each other and arranged in a line.

Each of the sliding plates 32 is located between the side plate 311 of the mounting plate 31 and the sidewall 13 of the first cooling fan 10 and slidably received in the sliding rail 312. The sliding plate 32 forms a first connecting portion 324 at a top corner of the sliding plate 32. The first connecting portion 324 defines a first mounting hole 327. The sliding plate 32 defines an elastically deformable tab 321 in a middle portion of the sliding plate 32, formed by, for example, punching. The tab 321 has a portion integrally connected with the sliding plate 32. The tab 321 forms a protruding member 322 and an operating arm 323 extending outwardly from the tab 321 towards the mounting plate 31. The protruding member 322 is located above the operating arm 323. The protruding member 322 corresponds to the positioning groove 313 (314, 315) and can be fittingly engaged in one of the positioning grooves 313, 314, 315. The operating arm 323 is L-shaped in profile and includes a lateral section 325 and a depending section 326. The lateral section 325 extends outwardly from the tab 321, and the depending section 326 extends downwardly and perpendicularly from an end of the lateral section 325. The depending section 326 of the operating arm 323 corresponds to the notch 317 of the mounting plate 31 and can pass through the mounting plate 31 via the notch 317. The lateral section 325 of the operating arm 323 can be slidably received in the sliding slot 316 of the mounting plate 31.

The second fan bracket 40 is L-shaped in profile and includes a bottom plate 41, a side plate 42 and two second connecting portions 43 at two opposite ends. The bottom plate 41 is mounted on the bottom wall 24 of the second cooling fan 20. The side plate 42 is perpendicular to the bottom plate 41 of the second fan bracket 40 and attached the sidewall 23 of the second cooling fan 20. The two second connecting portions 43 are symmetrically located at two opposite ends of the second fan bracket 40, with each connecting portion 43 formed at a joint of the bottom plate 41 and the side plate 42. Each of the second connecting portions 43 defines a second mounting hole 44. The second fan bracket 40 is located between the two sliding plates 32 of the first fan brackets 30. The second connecting portions 43 are attached to the first connecting portions 324, respectively, with the second mounting hole 44 of a second connecting portion 43 aligning with the first mounting hole 327 of a corresponding first connecting portion 324. A threaded portion 61 of a fastener 60, such as, for example, a screw, passes through the first mounting hole 327 and the second mounting hole 44, and engages a nut 62 whereby the first fan brackets 30 are connected with the second fan bracket 40 via the first connecting portions 324 and the second connecting portions 43.

Figure 5:
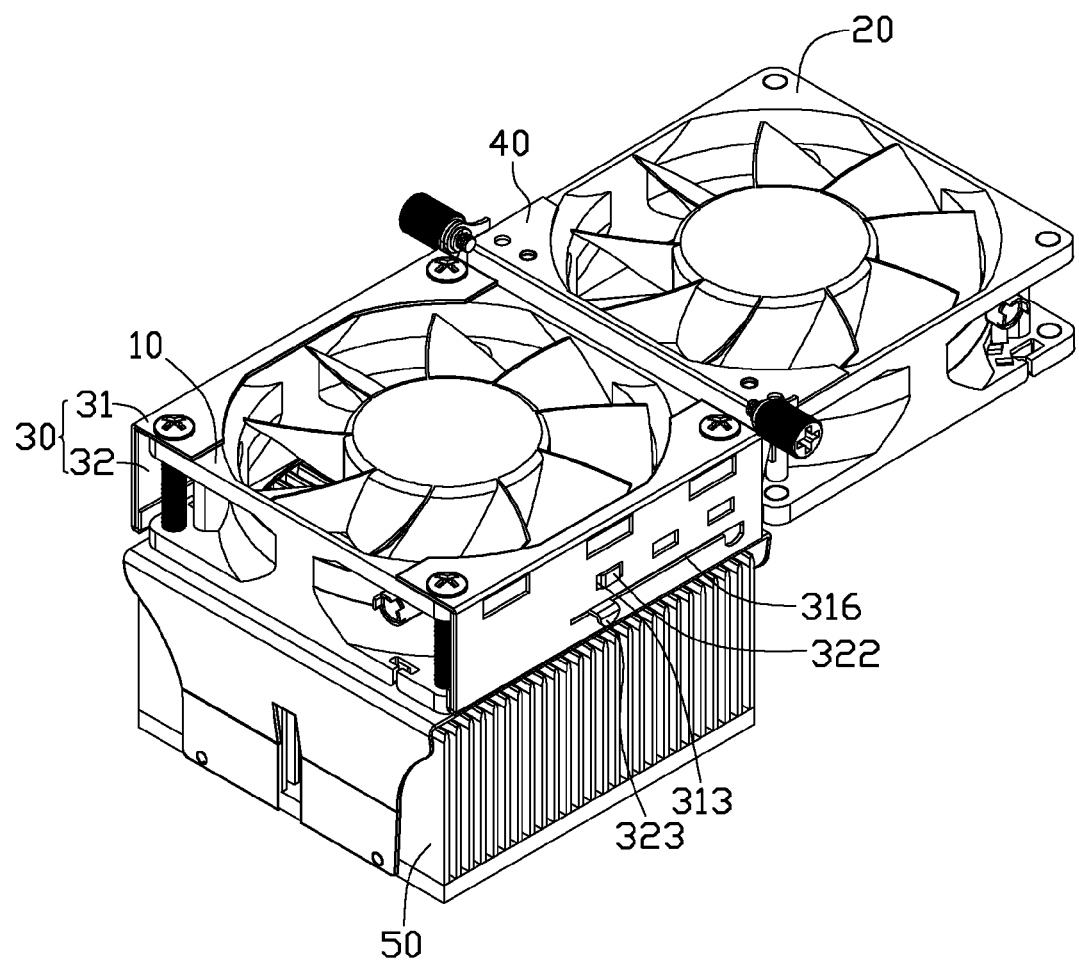
FIG. 5 is an assembled, isometric view of the cooling fan module in a second state.

FIG. 5 shows the cooling fan module 1 in a second state. The fasteners 60 are loosened, and the second cooling fan 20 is rotated 180° relative to the first cooling fan 10 whereby the second cooling fan 20 is located at a lateral side of the first cooling fan 10 and coplanar with the first cooling fan 10. The fasteners 60 are again tightly engaged with the nuts 62 whereby the second cooling fan 20 is connected with the first cooling fan 10 in the second state. In the second state, a first longitudinal axis of the first cooling fan 10 is parallel to and spaced a distance from a longitudinal axis of the second cooling fan 20. The first cooling fan 10 is located on the heat sink 50 thereby generating a first airflow to cool the heat sink 50 and the CPU, and the second cooling fan 20 is located above the memory card thereby onto which a second airflow is generated.

In the first state, the first cooling fan 10 and the second cooling fan 20 cooperatively generate airflow to cool the heat sink 50 and the CPU, thereby increasing airflow and enhancing heat dissipating efficiency of the cooling fan module 1. In the second state, the second cooling fan 20 provides airflow to cool the memory card while the first cooling fan 10 provides airflow to cool the heat sink 50 and the CPU.

Figure 6:
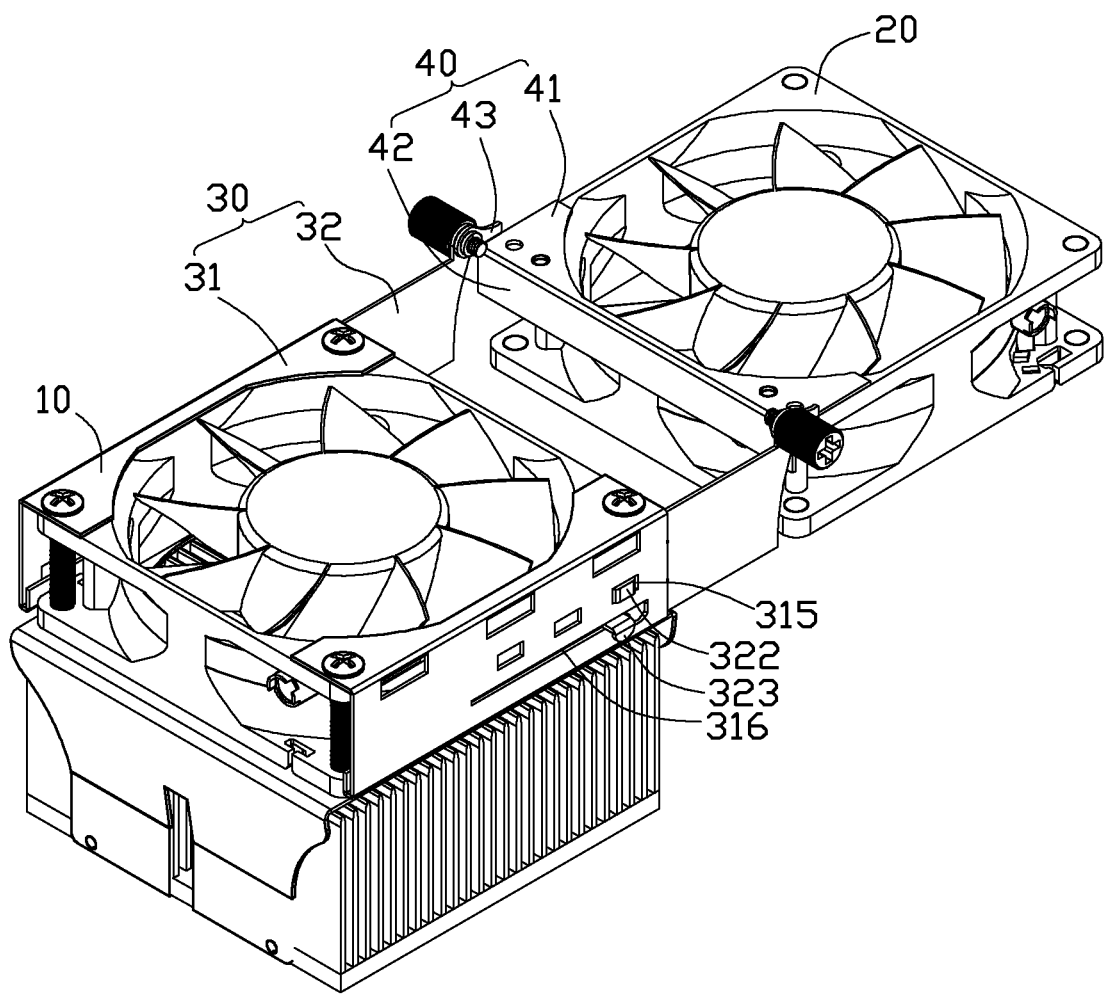
FIG. 6 is an assembled, isometric view of the cooling fan module of FIG. 5 with a first cooling fan partially moved relative to a second cooling fan.

Referring to FIG. 6, the two operating arms 323 of the sliding plate 32 are inwardly pressed whereby the two tabs 321 are deformed and contract inwardly toward the first cooling fan 10. When the protruding member 322 and the leftmost positioning groove 313 are separated, the second cooling fan 20 is pulled rightward whereby the second fan bracket 40 and the sliding plates 32 of the first fan bracket 30 move rightward relative to the first cooling fan 10 together with the second cooling fan 20. When the protruding member 322 arrives at the positioning groove 314 (315), the operating arms 323 are relaxed and the tabs 321 elastically return to their original state whereby the protruding member 322 is engaged in the positioning groove 314 (315) and the first cooling fan 10 is connected with the second cooling fan 20 again. Thus, a spacing between the first cooling fan 10 and the second cooling fan 20 can be adjusted.

It is to be understood, however, that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cooling fan module, comprising:
a first cooling fan; and
a second cooling fan pivotally connected with and rotatable relative to the first cooling fan between a first state and a second state, the second cooling fan being located on the first cooling fan in the first state, and the second cooling fan at a lateral side of the first cooling fan in the second state such that when in the first state the first and second cooling fans share a common rotational axis.

2. The cooling fan module of claim 1, wherein the first cooling fan and the second cooling fan are blowing axial fans.

3. The cooling fan module of claim 1, wherein the first cooling fan and the second cooling fan are exhausting axial fans.

4. The cooling fan module of claim 1, further comprising at least one first fan bracket and a second fan bracket, the at least one first fan bracket being mounted on the first cooling fan, the second fan bracket being mounted on the second cooling fan, and the second fan bracket connecting the at least one first fan bracket.

5. The cooling fan module of claim 4, wherein the at least one first fan bracket comprises two first fan brackets mounted at two opposite sides of the first cooling fan, respectively, and connected with two opposite ends of the second cooling fan, respectively.

6. The cooling fan module of claim 5, wherein each of the two first cooling fan brackets comprises a first connecting portion thereon and the second fan bracket comprises a second connecting portion thereon at each of its two opposite ends, wherein each of the two first fan brackets connects with the second fan bracket via the first connecting portion and one of the second connecting portions.

7. The cooling fan module of claim 5, wherein each of the first fan brackets comprises a mounting plate and a sliding plate, the mounting plate being mounted to the first cooling fan, the sliding plate being slidably connected with the mounting plate and located between the sliding plate and the first cooling fan, and the second fan bracket being connected with the sliding plate of the first fan bracket.

8. The cooling fan module of claim 7, wherein the mounting plate comprises a sliding rail in which the sliding plate is slidably received.

9. The cooling fan module of claim 8, wherein the sliding plate forms a deformable tab, the tab forms a protruding member, the mounting plate defines a positioning groove corresponding to and in which the protruding member is received.

10. The cooling fan module of claim 9, wherein the tab forms an operating arm, the mounting plate defines a sliding slot, and the operating arm is slidably received in the sliding slot.

* * * * *